US006772352B1

(12) United States Patent
Williams et al.

(10) Patent No.: US 6,772,352 B1
(45) Date of Patent: Aug. 3, 2004

(54) METHOD AND APPARATUS FOR REDUCING THE RATE OF COMMANDS BEING ISSUED IF THE RATE EXCEEDS A THRESHOLD WHICH IS BASED UPON A TEMPERATURE CURVE

(75) Inventors: Michael W. Williams, Citrus Heights, CA (US); James M. Dodd, Shingle Springs, CA (US)

(73) Assignee: Intel Corporation, Santa Clara, CA (US)

( * ) Notice: Subject to any disclaimer, the term of this patent is extended or adjusted under 35 U.S.C. 154(b) by 535 days.

(21) Appl. No.: 09/677,137

(22) Filed: Sep. 29, 2000

(51) Int. Cl.[7] .............................. G06F 12/00; G06F 1/26
(52) U.S. Cl. ...................... 713/300; 711/104; 711/105; 711/167
(58) Field of Search ................................ 713/300, 320, 713/322, 321, 323; 702/130; 711/154, 167, 104, 105

(56) References Cited

U.S. PATENT DOCUMENTS

| 5,254,883 | A | | 10/1993 | Horowitz et al. | |
|---|---|---|---|---|---|
| 5,719,800 | A | * | 2/1998 | Mittal et al. | ................. 713/321 |
| 5,915,232 | A | * | 6/1999 | McMinn | ..................... 702/130 |
| 6,021,076 | A | | 2/2000 | Woo et al. | |
| 6,029,006 | A | * | 2/2000 | Alexander et al. | .......... 713/323 |
| 6,075,730 | A | | 6/2000 | Barth et al. | |
| 6,185,644 | B1 | | 2/2001 | Farmwald et al. | |
| 6,442,700 | B1 | * | 8/2002 | Cooper | ........................ 713/320 |
| 6,513,124 | B1 | * | 1/2003 | Furuichi et al. | ............. 713/322 |
| 6,662,278 | B1 | * | 12/2003 | Kahn et al. | .................. 711/154 |

FOREIGN PATENT DOCUMENTS

| JP | 03019052 A | * | 1/1991 | ........... G06F/12/16 |
|---|---|---|---|---|
| JP | 04238517 A | * | 8/1992 | ............. G06F/1/26 |

OTHER PUBLICATIONS

IBM, Direct Rambus Memory System Overview, Mar. 30, 1998, pp. 1–6.*

* cited by examiner

*Primary Examiner*—Thomas Lee
*Assistant Examiner*—Mark Connolly
(74) *Attorney, Agent, or Firm*—Pillsbury Winthrop LLP

(57) ABSTRACT

A method of issuing activate commands to a memory device includes issuing the activate commands to the memory device. A number of activate commands issued within a time period is counted. A determination is made as to whether the number of activate commands issued within the time period exceeds a threshold. The rate at which the activate commands are being issued is lowered if the number of activate commands being issued exceeds the threshold within the time period.

33 Claims, 3 Drawing Sheets

CONTROLLER OR OTHER
MEMORY COMPONENT(S)

METHOD AND APPARATUS FOR REDUCING THE RATE OF COMMANDS BEING ISSUED IF THE RATE EXCEEDS A THRESHOLD WHICH IS BASED UPON A TEMPERATURE CURVE

BACKGROUND OF THE INVENTION

1. Field of the Invention

The present invention relates generally to a memory system, and more specifically, to a power management memory system having high performance.

2. Discussion of the Related Art

In order to prevent potentially damaging power consumption, manufacturers and vendors of memory devices, such as dynamic random access memory (DRAM) devices, prescribe specifications for the safe operation of the memory devices. These specifications are often created based on an excessive worst case scenario a memory device may encounter, and not based on the core architecture capabilities of the memory device and real-world conditions.

For example, DRAM vendors may prescribe a particular minimum and maximum time interval for issuing successive "activate" commands of row-address-strobe (RAS) banks within the same DRAM component, such as RAS bank "A", and then a subsequent activate command on RAS bank "B". This time interval is known as "RAS-to-RAS delay", also called "tRRD". However, the maximum tRRD specifications prescribed by the DRAM vendors are typically over-inflated because DRAM vendors assume that an infinite stream of activate commands will be issued to the DRAM device during its operation. Under this assumption, the DRAM vendors define an inflated interval based on this infinite access pattern, which spreads the power dissipation over more time to achieve an average power that is within a safety margin to protect the DRAM device from thermal breakdown.

However, in real-world operation of DRAM devices, infinite streams of activate commands do not occur. Rather, DRAM access utilizing activate commands occurs in "bursts". In other words, typical DRAM access occurs with bursts of activate commands, and the activate commands are not issued in back-to-back infinite streams. Periods of inactivity occur in between these activate command bursts. But, because of the maximum tRRD specifications set forth by the DRAM vendors, which are artificially inflated, the real-world operational nature of DRAM access is not utilized in the most efficient manner possible.

DETAILED DESCRIPTION

Figure 1:
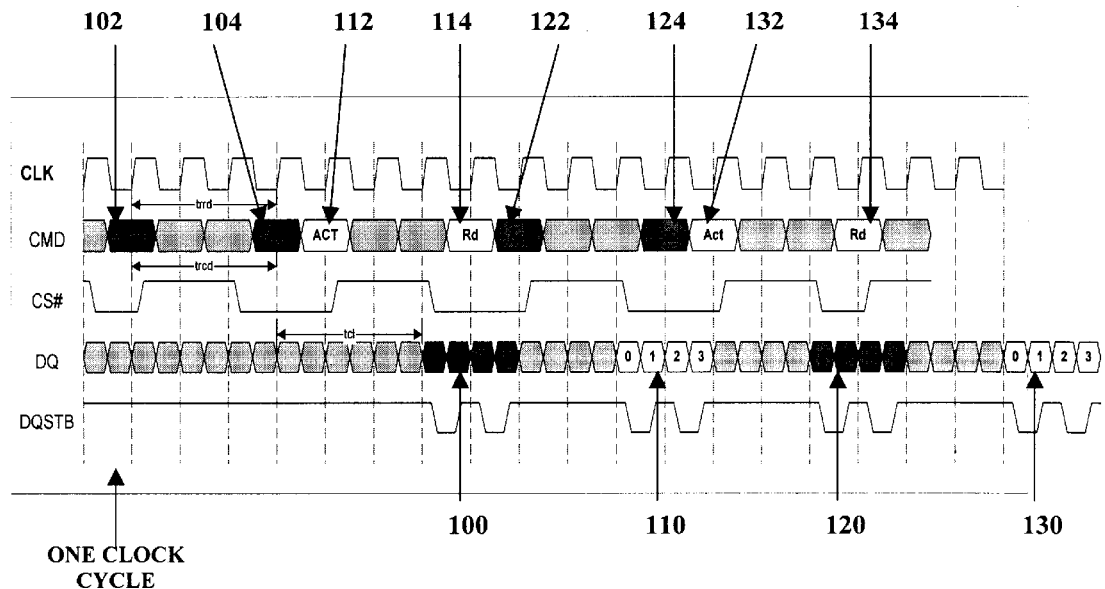
FIG. 1 illustrates a timing waveform diagram of activate commands in a memory device according to the prior art.

FIG. 1 illustrates a timing waveform diagram of activate commands in a memory device according to the prior art. Clock cycles (CLK) are represented at the top line of the timing waveform diagram in FIG. 1. The command line (CMD) illustrates when an activate command (ACT) or a read command (Rd) is issued. The data bus line (DQ) illustrates when the data is read from the memory device and outputted onto the data bus. The RAS-to-RAS delay (tRRD), as shown in FIG. 1, is set at three clock periods (with each clock period being the same time as a clock cycle). The RAS-to-CAS (column-address-strobe) delay time (tRCD), the time interval between an activate (RAS) command and a read (or write) command, as shown in FIG. 1, is also at three clock periods.

The DQ line in FIG. 1 shows that the data bus is not saturated with data, but that two clock periods (or a single read of data blocks 0–3) transpire and are wasted in between each data transmission 100, 110, 120, 130. The activate (ACT) command 102 initiates the read (Rd) command (Rd) 104, which results in transmission of data 100 (blocks 0–3), occupying two clock periods. Similarly, ACT command 112 initiates Rd command 114, which results in the output of data 110; ACT command 122 initiates Rd command 124, which results in the output of data 120; and ACT command 132 initiates Rd command 134, which results in the output of data 130. According to the prior art embodiment illustrated in FIG. 1, due to the artificially-inflated tRRD specification (which determines how close in time each ACT command may be issued), at least two clock periods, equivalent to a single data read, lapses in between each data 100, 110, 120, 130 output. These lapsed clock periods are unused and wasted. In real-world operation, more than two clock periods may lapse in between each data output 100, 110, 120, 130.

Figure 3:
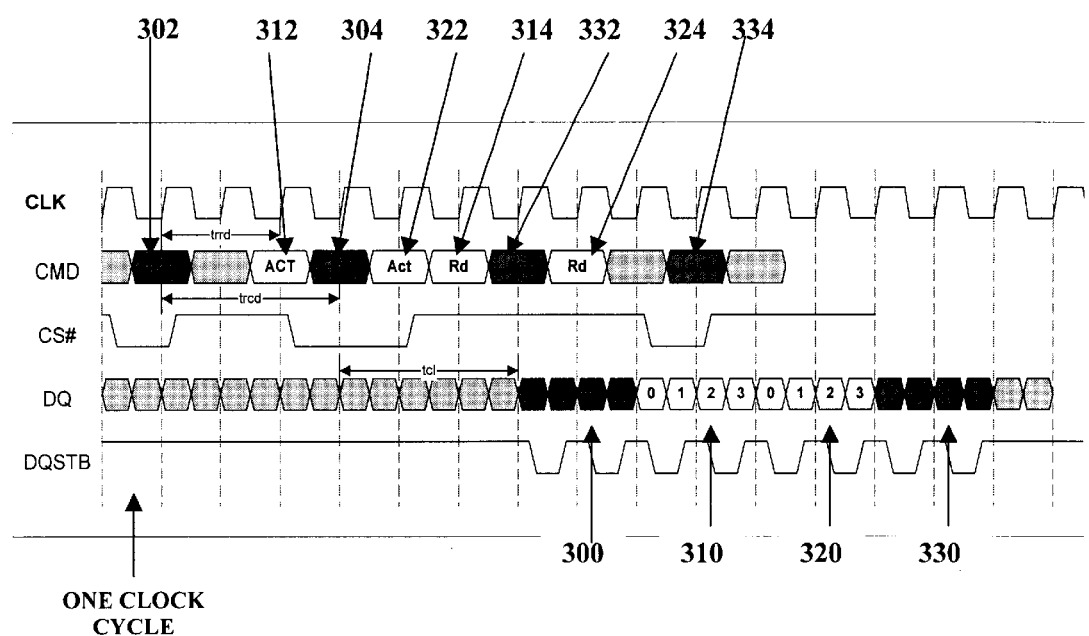
FIG. 3 illustrates a timing waveform diagram of activate commands in a memory device according to an embodiment of the present invention.

FIG. 3 illustrates a timing waveform diagram of activate commands in a memory device according to an embodiment of the present invention. In the real-world operation of memory devices, such as DRAMs, activate commands are issued in "bursts" and not in infinite streams. According to the invention, the activate commands within a burst may be issued quickly, limited only by the minimum tRRD interval as bounded by the core architecture of the memory device, without exceeding the thermal breakdown limit of the memory device for a particular burst. Because there are often periods of inactivity between bursts, these periods of inactivity provide "cooling off" time for the memory device. Therefore, due to the burst nature of DRAM operation and the periods of inactivity (cooling off time) occurring in between each burst, activate commands may be issued to the DRAMs utilizing the minimum tRRD intervals within a burst, without reaching the thermal breakdown limits. In this manner, the DQ line may be better saturated with data, creating a more efficient operation of the memory device without being bound by artificial limitations. The artificial tRRD specifications inflating the time intervals between issuance of ACT commands result in not keeping the data bus saturated within a burst, as illustrated in FIG. 1. Therefore, the most efficient operation of the memory device is not achieved.

As shown in FIG. 3, for example, the DQ line is saturated with data 300, 310, 320, 330 so that the data is output back-to-back without any unused and wasted "gaps" during the activate command burst. Therefore, when activate commands are issued, the data may be output onto the data bus faster and more efficiently. By decreasing the time interval between activating a page in a DRAM component to activating another page in the same DRAM component, i.e., lowering the time interval of the DRAM vendor specified tRRD specification, the data bus may be kept saturated with data output without any unused or wasted gaps within an activate burst. The minimum tRRD interval, as bounded by the core architecture of the memory device, remains the lower bound of the time interval between each successive ACT command.

In the event that there are a plurality of bursts issued one after the other having insufficient periods of inactivity between each burst for cooling off, a mechanism is required to prevent the memory device from thermal breakdown. In particular, throttling of the ACT commands may be required to slow the issuance of ACT commands to the memory device, thus reducing the heat generated by each command to which the memory device responds, and cooling off the memory device. FIG. 3 illustrates a waveform diagram where the memory device is not restricted to a DRAM vendor's inflated tRRD specifications. As shown in the burst in FIG. 3, the activate commands following ACT command 312 are issued in the next available cycle, as shown, for example, by ACT command 322 and ACT command 332. Under this scheme, the data bus is saturated with data, as shown in the DQ line, where data blocks 300, 310, 320, and 330 are output consecutively in the burst, without any unused or wasted cycles in between.

Due to the minimum tRRD specification of the memory device example illustrated in FIG. 3, activate commands may not be issued less than two clock periods apart. However, in the example illustrated in FIG. 1, the tRRD specification was artificially inflated to three clock periods, resulting in gaps of data created in the DQ line, unlike the DQ line shown in FIG. 3, where the data bus is saturated with data 300, 310, 320, 330 for the burst. The tRCD interval shown in FIG. 3 is at three clock periods. The CAS read latency interval (tCL), the period of time from a read (or write) command to data output onto the data bus, is three clock periods as well. That is, when ACT command 302 is issued, Rd command 304 is issued after three clock periods (tRCD) from the ACT command 302. Then, data 300 is output onto the data bus after three clock periods (tCL). Similarly, ACT command 312 initiates Rd command 314, which results in data 310 being output onto the data bus. ACT command 322, issued after the minimum tRRD interval of two clock periods from ACT command 312 and in the next immediate opening in the CMD line (after the Rd command 304), initiates the Rd command 324, resulting in data 320 being output onto the data bus. Finally, in the burst example of FIG. 3, ACT command 332 is issued after the minimum tRRD interval of two clock periods from ACT command 322 and in the next immediate opening in the CMD line (after Rd command 314), resulting in data 330 being output onto the data bus.

Figure 2:
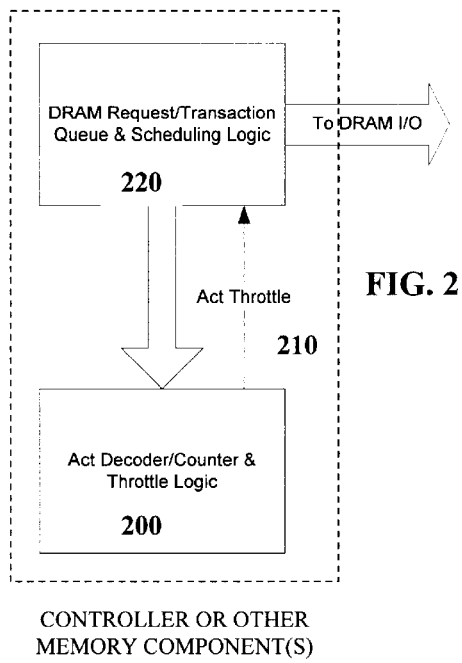
FIG. 2 illustrates a block diagram of memory control logic to implement a power management scheme according to an embodiment of the present invention.

FIG. 2 illustrates a block diagram of memory control logic to implement a power management scheme according to an embodiment of the present invention. The logic 200, 220 illustrated in FIG. 2 preferably resides in a memory controller. However, the logic 200, 220 may be distributed across the various components of a memory system, or residing completely within one component, such as the memory module itself, like a dual-inline memory module (DIMM). As mentioned above, because it is possible for a plurality of activate command bursts to occur successively without having sufficient periods of inactivity for cooling off in between each burst, a mechanism is required to prevent the memory device from thermal breakdown. As shown in FIG. 2, preferably in a memory controller device connected to the memory device(s), there is logic 220 to perform the request, transaction queue, and scheduling of the command functions for the memory device. The data related to activate commands issued to the memory device is provided to the logic for counting the activate commands within specified time periods, with logic 200 to throttle the rate of the activate commands issued to the memory device when the rate of the activate commands exceeds a safety threshold. In other words, when it is determined that a number of activate commands issued within a particular time period will potentially result in thermal breakdown of the memory device, a threshold value corresponding to the number of activate commands per time interval is set so that throttling occurs when the threshold is reached and just prior to the occurrence of thermal breakdown of the memory device.

To determine the temperature of a memory device relative to the rate of activate commands issued in a given time period, a temperature curve is preferably generated for the memory device. The number of activate commands being issued is counted with respect to a time interval. Once the temperature curve for a number of activate commands within a time period is known, a threshold may be determined so that when a number of activate commands issued to the memory device exceeds the threshold number within a time period, throttling 210 of the activate commands may occur. In other words, the rate of the activate commands being issued to the memory device is lowered to a rate where it is safe to issue activate commands without exceeding the power dissipation envelope where thermal breakdown occurs. The throttling may be progressive. That is, various "slower" rates may be utilized, and the rate may be gradually lowered, or, the activate commands may be throttled completely down to an absolute "safe" rate, such as that prescribed by the DRAM vendors in the maximum tRRD specification.

Moreover, the memory system of the present invention may include a temperature sensor coupled to the memory device. The temperature sensor may be utilized to reflect the actual temperature of the memory device during its operation. Therefore, if the temperature sensor indicates that the memory device is operating above a given threshold temperature, throttling 210 of the activate commands issued to the memory device may occur. Therefore, the temperature sensor may be utilized independently, or in combination with the counting of activate commands to determine whether the memory device is operating within a safe temperature range, and to throttle 210 the activation commands, if necessary.

Figure 4:
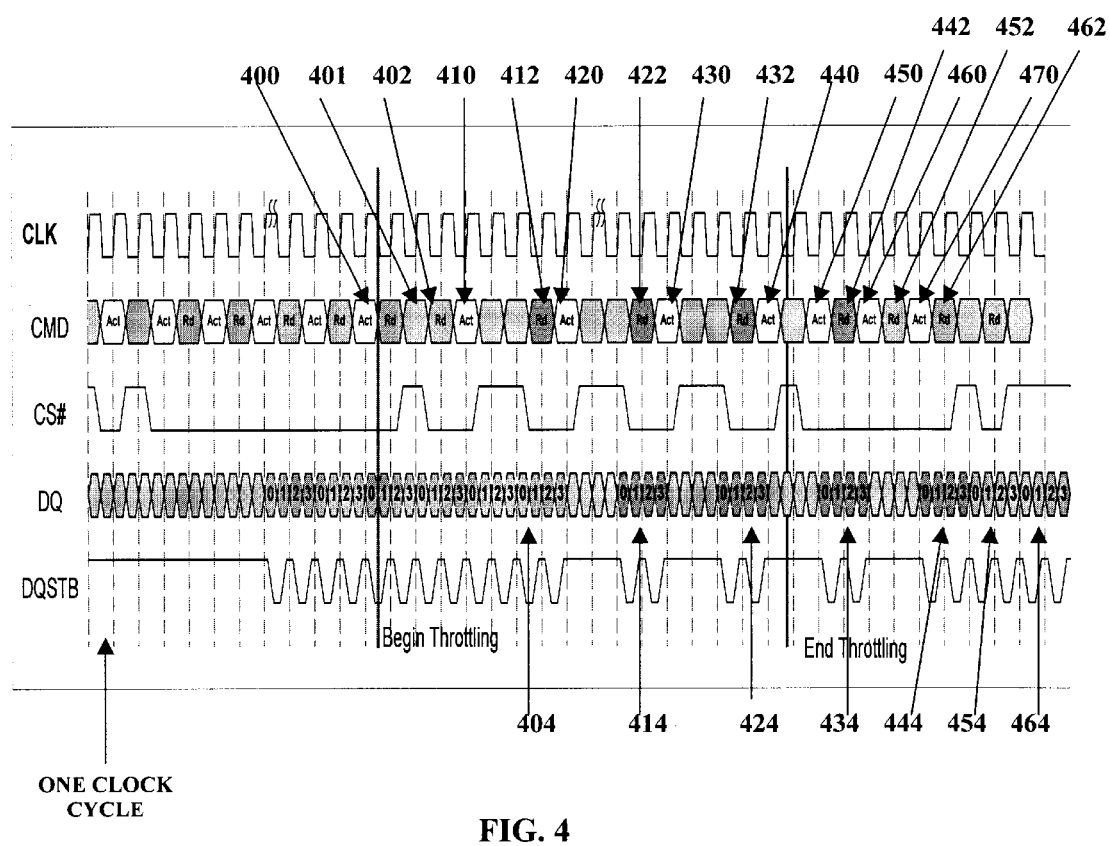
FIG. 4 illustrates a timing waveform diagram of throttling and end-throttling of activate commands in a memory device according to an embodiment of the present invention.

FIG. 4 illustrates a timing waveform diagram of throttling and end-throttling of activate commands in a memory device according to an embodiment of the present invention. As shown in the CMD line, prior to the initialization of the throttling of the ACT commands, the ACT commands are issued consecutively after each other, limited only by the minimum tRRD interval of two clock periods (as previously set forth in FIG. 3). However, after throttling is initiated following ACT command 400, the ACT commands issued within the throttling interval are greater apart than the minimum tRRD interval of two clock periods. For example, the successive ACT command following ACT command 400 is ACT command 410, which is issued in the fourth clock period following ACT command 400, while all of the ACT commands prior to ACT 400 were issued in the second clock period following each other. In this example, the ACT commands 410, 420, 430, 440 issued after initialization of the throttling are three clock periods apart.

When throttling is ended following ACT command 440, ACT commands 450, 460, 470 are issued closer together in time, being only two clock periods apart, as in the case prior to the initiation of throttling. As shown in FIG. 4, shortly after throttling is initiated, the DQ line becomes less saturated with data, and two clock periods are unused between data blocks 404 and 414; data blocks 414 and 424; data blocks 424 and 434; and data blocks 434 and 444. These periods of inactivity allow for the memory device to "cool down". Data block 404 is output onto the data bus following Rd command 402, which was initiated by ACT command 400. Data block 414 is output onto the data bus following Rd command 412, which was initiated by ACT command 410. Data block 424 is output onto the data bus following Rd command 422, which was initiated by ACT command 420. Data block 434 is output onto the data bus following Rd command 432, which was initiated by ACT command 430. Data block 444 is outputted onto the data bus following Rd command 442, which was initiated by ACT command 440. A power dissipation envelope may be generated and utilized to determine how much throttling to use, and how long to apply the throttling in order to prevent thermal breakdown.

In a memory device, such as a DRAM, a non-volatile storage device is provided to identify the memory device type, the memory organization, and timing and other critical parameters. These non-volatile storage devices are often electrically-erasable programmable read-only-memory (EEPROM) devices, also called serial presence detect (SPD) devices. The SPD devices include specifications, such as the minimum and maximum (inflated) tRRD specifications, as designated by a DRAM vendor. Therefore, from the SPD device, a memory controller may determine the operational parameters of the particular memory device coupled thereto, and adjust the issuance of commands accordingly. The memory controller may follow the maximum tRRD specification, as prescribed by the DRAM vendor, or utilize a tRRD interval anywhere in between the maximum tRRD interval and the minimum tRRD interval. The memory devices themselves are not cognizant of the control by the memory controller, or whether shorter tRRD intervals other than the prescribed maximum tRRD interval are utilized.

In summary, because of the real-world operational nature of memory devices, such as DRAMs, where activate commands are issued in bursts, the activate commands issued within a burst are preferably not limited to the maximum tRRD intervals set forth by the DRAM vendors. These maximum tRRD intervals are the absolute safe time periods that are calculated based on an inaccurate assumption that an infinite stream of activate commands are issued to a memory device. Therefore, by issuing the activate commands to the memory device as quickly as possible within a burst, limited only by the minimum tRRD specification as set forth by the core architecture of the memory device, the artificial boundary prescribed by the DRAM vendors is removed, thus allowing more efficient operation of the memory device. Because periods of inactivity occur in between bursts, the memory device can "cool off" during these periods of inactivity, and the memory device is able to operate at its maximum capacity during each burst. Accordingly, throttling logic is provided so that even if the rate of activate commands exceed a safe threshold limit for a given time interval, the rate of the activate commands may be throttled in order to slow down the activate commands being issued, thus generating less heat within the given time interval to cool off the memory device. Throttling may occur on and off throughout the operation of the memory device, and different levels or rates of throttling may be utilized as well.

Additionally, besides the activate commands discussed above, other row commands may be throttled as well, including refresh commands and precharge commands. In other words, the same logic for throttling of the activate commands may be applied to other row commands, such as the refresh commands and precharge commands. With throttling logic, memory devices being issued row commands may operate at their optimum levels without running the risk of damaging the memory device.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A method comprising:

issuing row commands to a memory device;
   counting a number of the row commands issued within a time period; determining whether the number of row commands issued within the time period exceeds a threshold, wherein the threshold is set based on a temperature curve formed from a plurality of measured temperatures of the memory device, each one of the plurality of measured temperatures being associated with a rate of row commands issued within the time period; and
   lowering a rate of row commands being issued if the number of row commands being issued exceeds the threshold within the time period.

2. The method according to claim 1, wherein the row commands include at least one of an activate command, a refresh command, and a precharge command.

3. The method according to claim 1, wherein the memory device is a dynamic random access memory (DRAM).

4. The method according to claim 1, wherein the threshold is based on a temperature limit for safe operation of the memory device.

5. A memory controller to control a memory device, the memory controller having logic to:

issue row commands to the memory device;
   count a number of row commands issued within a time period;
   determine whether the number of row commands issued within the time period exceeds a threshold, wherein the threshold is set based on a temperature curve formed from a plurality of measured temperatures of the memory device, each one of the plurality of measured temperatures being associated with a rate of row commands issued within the time period; and
   lower a rate of row commands being issued if the number of row commands being issued exceeds the threshold within the time period.

6. The memory controller according to claim 5, wherein the row commands include at least one of an activate command, a refresh command, and a precharge command.

7. The memory controller according to claim 5, wherein the memory device is a dynamic random access memory (DRAM).

8. The memory controller according to claim 5, wherein the threshold is based on a temperature limit for safe operation of the memory device.

9. A memory system, comprising:

a memory device; and a memory controller coupled to the memory device to control the memory device, the memory controller including logic to issue row commands to the memory device, count a number of row commands issued within a time period, determine whether the number of row commands issued within the time period exceeds a threshold, and lower a rate of row commands being issued if the number of row commands being issued exceeds the threshold within the time period, wherein the threshold is set based on a temperature curve formed from a plurality of measured temperatures of the memory device, each one of the plurality of measured temperatures being associated with a rate of row commands issued within the time period.

10. The memory system according to claim 9, wherein the row commands include at least one of an activate command, a refresh command, and a precharge command.

11. The memory system according to claim 9, wherein the memory device is a dynamic random access memory (DRAM).

12. The memory system according to claim 9, wherein the threshold is based on a temperature limit for safe operation of the memory device.

13. A method comprising:

issuing activate commands to a memory device;

counting a number of the activate commands issued within a time period;

determining whether the number of activate commands issued within the time period exceeds a threshold, wherein the threshold is set based on a temperature curve formed from a plurality of measured temperatures of the memory device, each one of the plurality of measured temperatures being associated with a rate of activate commands issued within the time period; and lowering a rate of activate commands being issued if the number of activate commands being issued exceeds the threshold within the time period.

14. The method according to claim 13, wherein the memory device is a dynamic random access memory (DRAM).

15. The method according to claim 13, wherein the threshold is based on a temperature limit for safe operation of the memory device.

16. The method according to claim 13, wherein the number of activate commands issued within the time period are issued at intervals less than a maximum tRRD interval and not less than a minimum tRRD interval, prior to lowering the rate of activate commands being issued.

17. The method according to claim 13, wherein each activate command initiates a read command to read data from the memory device.

18. The method according to claim 13, wherein issuing the activate commands to the memory device occurs in a burst.

19. The method according to claim 13, further including:

determining a temperature of the memory device utilizing a temperature sensor;

determining whether the temperature of the memory device exceeds a threshold temperature for safe operation of the memory device; and lowering the rate of activate commands being issued if the temperature exceeds the threshold temperature.

20. A memory controller to control a memory device, the memory controller having logic to:

issue activate commands to the memory device;

count a number of activate commands issued within a time period;

determine whether the number of activate commands issued within the time period exceeds a threshold, wherein the threshold is set based on a temperature curve formed from a plurality of measured temperatures of the memory device, each one of the plurality of measured temperatures being associated with a rate of activate commands issued within the time period; and lower a rate of activate commands being issued if the number of activate commands being issued exceeds the threshold within the time period.

21. The memory controller according to claim 20, wherein the memory device is a dynamic random access memory (DRAM).

22. The memory controller according to claim 20, wherein the threshold is based on a temperature limit for safe operation of the memory device.

23. The memory controller according to claim 20, wherein the number of activate commands issued within the time period are issued at intervals less than a maximum tRRD interval and not less than a minimum tRRD interval, prior to lowering the rate of activate commands being issued.

24. The memory controller according to claim 20, wherein each activate command initiates a read command to read data from the memory device.

25. The memory controller according to claim 20, wherein the activate commands are issued to the memory device in a burst.

26. The memory controller according to claim 20, further including logic to:

determine a temperature of the memory device utilizing a temperature sensor;

determine whether the temperature of the memory device exceeds a threshold temperature for safe operation of the memory device; and lower the rate of activate commands being issued if the temperature exceeds the threshold temperature.

27. A memory system, comprising:

a memory device; and a memory controller coupled to the memory device to control the memory device, the memory controller including logic to issue activate commands to the memory device, count a number of activate commands issued within a time period, determine whether the number of activate commands issued within the time period exceeds a threshold, and lower a rate of activate commands being issued if the number of activate commands being issued exceeds the threshold within the time period, wherein the threshold is set based on a temperature curve formed from a plurality of measured temperatures of the memory device, each one of the plurality of measured temperatures being associated with a rate of activate commands issued within the time period.

28. The memory system according to claim 27, wherein the memory device is a dynamic random access memory (DRAM).

29. The memory system according to claim 27, wherein the threshold is based on a temperature limit for safe operation of the memory device.

30. The memory system according to claim 27, wherein the number of activate commands issued within the time period are issued by the memory controller at intervals less than a maximum tRRD interval and not less than a minimum tRRD interval, prior to lowering the rate of activate commands being issued.

31. The memory system according to claim 27, wherein each activate command issued by the memory controller initiates a read command to read data from the memory device.

32. The memory system according to claim 27, wherein the activate commands are issued by the memory controller to the memory device in a burst.

33. The memory system according to claim 27, further including:
a temperature sensor, coupled to the memory device and the memory controller, to determine a temperature of the memory device, wherein the memory controller further includes logic to determine whether the temperature of the memory device exceeds a threshold temperature for safe operation of the memory device, and lower the rate of activate commands being issued if the temperature exceeds the threshold temperature.

* * * * *